(12) United States Patent
He et al.

(10) Patent No.: US 11,087,112 B2
(45) Date of Patent: Aug. 10, 2021

(54) DISPLAY PANEL AND METHOD FOR FABRICATING THE SAME, DISPLAY DEVICE AND FINGERPRINT RECOGNITION METHOD

(71) Applicants: Chengdu BOE Optoelectronics Technology Co., Ltd., Sichuan (CN); BOE TECHNOLOGY GROUP CO., LTD., Beijing (CN)

(72) Inventors: Yuedi He, Beijing (CN); Guoqiang Tang, Beijing (CN); Yingsong Xu, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 71 days.

(21) Appl. No.: 16/698,435

(22) Filed: Nov. 27, 2019

(65) Prior Publication Data
US 2020/0226341 A1  Jul. 16, 2020

(30) Foreign Application Priority Data

Jan. 14, 2019 (CN) .......................... 201910032089.2

(51) Int. Cl.
*G06K 9/00* (2006.01)
*G06F 3/041* (2006.01)
*H01L 27/32* (2006.01)

(52) U.S. Cl.
CPC ......... *G06K 9/0004* (2013.01); *G06F 3/0412* (2013.01); *G06K 9/0002* (2013.01); *G06K 9/00046* (2013.01); *H01L 27/323* (2013.01); *H01L 27/3234* (2013.01)

(58) Field of Classification Search
CPC ........ G06K 9/00006–0012; G06K 2009/0006; G06F 3/041–047
See application file for complete search history.

(56) References Cited

U.S. PATENT DOCUMENTS

| 10,726,236 | B2* | 7/2020 | Li | ........................ G06K 9/0004 |
| 10,810,294 | B2* | 10/2020 | Yim | ................. H04N 21/42201 |
| 2017/0371213 | A1* | 12/2017 | Wang | ................ G02F 1/136277 |

(Continued)

FOREIGN PATENT DOCUMENTS

| CN | 106249457 A | 12/2016 |
| CN | 106775109 A | 5/2017 |

(Continued)

OTHER PUBLICATIONS

First Office Action issued to Chinese Application No. 201910032089.2 dated Jun. 30, 2020 with English translation, (38p).

*Primary Examiner* — Patrick F Marinelli
(74) *Attorney, Agent, or Firm* — Arch & Lake LLP

(57) ABSTRACT

The present disclosure provides a display panel and a method for fabricating the same, a display device and a fingerprint recognition method and belongs to the field of display technologies. The display panel includes a base substrate, a plurality of pixel units and a plurality of photosensitive units. The photosensitive units and the pixel units are disposed on the same side of the base substrate. Each of the photosensitive units is disposed between adjacent ones of the pixel units.

12 Claims, 3 Drawing Sheets

(56) References Cited

U.S. PATENT DOCUMENTS

| | | | |
|---|---|---|---|
| 2018/0053032 A1* | 2/2018 | Ding | G06K 9/0004 |
| 2018/0165498 A1* | 6/2018 | Xie | G06K 9/0004 |
| 2019/0012509 A1* | 1/2019 | Li | G09G 3/3208 |
| 2019/0251324 A1* | 8/2019 | Yim | G06F 21/602 |
| 2019/0386033 A1* | 12/2019 | Li | H01L 51/5209 |
| 2020/0081286 A1* | 3/2020 | Tzeng | G06F 3/0421 |
| 2020/0201117 A1* | 6/2020 | Zheng | G02F 1/133606 |
| 2020/0218866 A1* | 7/2020 | Yang | H01L 51/56 |
| 2020/0226341 A1* | 7/2020 | He | H01L 27/323 |

FOREIGN PATENT DOCUMENTS

| | | |
|---|---|---|
| CN | 107946346 A | 4/2018 |
| CN | 108511499 A | 9/2018 |
| CN | 109062430 A | 12/2018 |
| CN | 109065582 A | 12/2018 |

* cited by examiner

DISPLAY PANEL AND METHOD FOR FABRICATING THE SAME, DISPLAY DEVICE AND FINGERPRINT RECOGNITION METHOD

CROSS-REFERENCE

This application is based upon and claims priority to Chinese Patent Application No. 201910032089.2, filed on Jan. 14, 2019, the entire contents thereof are incorporated herein by reference.

TECHNICAL FIELD

The present disclosure relates to the field of display technologies, and more particularly, to a display panel and a method for fabricating the same, a display device and a fingerprint recognition method.

BACKGROUND

Fingerprint identification technology is the most widely used technology in biometric identification technology. At present, fingerprint image acquisition devices have mainly included optical scanning devices (for example, micro prism matrixes), temperature difference inductive fingerprint sensors, semiconductor fingerprint sensors (for example, capacitive fingerprint sensors and pressure sensitive fingerprint sensors), optical fingerprint sensors (for example, pinhole imaging fingerprint sensors and collimation fingerprint sensors) and ultrasonic fingerprint scanning devices. Among them, the semiconductor fingerprint sensors, especially capacitive fingerprint recognition technologies, are the most commonly used.

At present, the fingerprint recognition sensors in majority of smart devices have been embedded in their front home buttons or at the back of their bodies, so an independent physical button is necessarily provided, which hinders the development of display devices with a high screen-to-body ratio. The in-screen fingerprint recognition technology carries out fingerprint recognition using a virtual button, but the fact that an external fingerprint recognition sensor needs to be provided cannot be ignored. The mainstream fingerprint recognition sensors are manufactured by silicon-based CMOS (Complementary Metal Oxide Semiconductor) processes and the cost of manufacturing a large-area fingerprint recognition sensor puts a limit on its development in the field of full-screen fingerprint recognition technology.

The above-described information disclosed in this Background are only provided for the better understanding of the background of this disclosure and therefore it may include information that does not form the existing technology already known to those of ordinary skill in the art.

SUMMARY

The present disclosure provides a display panel and a method for fabricating the same, a display device and a fingerprint recognition method.

According to a first aspect of the present disclosure, there is provided a display panel. The display panel includes a base substrate. The display panel includes a plurality of pixel units disposed in array on a first side of the base substrate. The display panel includes a plurality of photosensitive units disposed on the first side of the base substrate. Each of the photosensitive units being disposed between the adjacent pixel units.

In an exemplary arrangement of the present disclosure, the display panel includes a display region and the photosensitive units are disposed in array in all or part of the display region.

In an exemplary arrangement of the present disclosure, each of the photosensitive units includes a first electrode disposed on the first side of the base substrate. Each of the photosensitive units includes a photosensitive element disposed on a surface of the first electrode away from the substrate base. Each of the photosensitive units includes a first switching device disposed on the first side of the base substrate and having an input end electrically connected to the first electrode.

In an exemplary arrangement of the present disclosure, the first switching device is a first thin film transistor which has a source or drain electrode electrically connected to the first electrode. The first thin film transistor is an oxide thin film transistor or an organic thin film transistor.

In an exemplary arrangement of the present disclosure, each of the pixel units includes a second thin film transistor disposed on the first side of the base substrate. The second thin film transistor has a gate electrode which is disposed on the same layer and made of the same material as those of a gate electrode of the first thin film transistor, and has source and drain electrodes which are disposed on the same layer and are made of the same material as those of the source and drain electrodes of the first thin film transistor.

In an exemplary arrangement of the present disclosure, each of the pixel units further includes a second electrode disposed on the same layer and made of the same material as the first electrode and electrically connected to the source or drain electrode of the second thin film transistor. Each of the pixel units further includes a light-emitting element disposed on a surface of the second electrode away from the base substrate.

In an exemplary arrangement of the present disclosure, the display panel further includes a common electrode disposed on a surface of the photosensitive element away from the first electrode and on a surface of the light-emitting element away from the second electrode. The common electrode is an integral structure.

In an exemplary arrangement of the present disclosure, the display panel further includes a black matrix layer disposed on a side of the pixel unit and the photosensitive unit away from the substrate. The display panel further includes a plurality of first light-transmitting windows disposed in the black matrix layer. Each of the first light-transmitting windows is disposed in one-to-one correspondence to each of sub-pixels of each of the pixel units. An orthographic projection of each of the sub-pixels on the base substrate is at least partially overlapped with an orthographic projection of the first light-transmitting window corresponding thereto on the base substrate. The display panel further includes a plurality of second light-transmitting windows disposed in the black matrix layer. Each of the second light-transmitting windows is disposed in one-to-one correspondence to each of the photosensitive units. An orthographic projection of any of the photosensitive units on the base substrate is at least partially overlapped with an orthographic projection of the second light-transmitting window corresponding thereto on the base substrate.

In an exemplary arrangement of the present disclosure, the display panel further includes a color film layer disposed on a side of the pixel unit and the photosensitive unit away from the base substrate and a plurality of color film units. Each of the color film units is disposed in one-to-one correspondence to each of the sub-pixels of each of the pixel units. An orthographic projection of each of the color film units on the base substrate is at least partially overlapped with an orthographic projection of the sub-pixel corresponding thereto on the base substrate.

In an exemplary arrangement of the present disclosure, the display panel further includes a touch circuit layer disposed on a side of the pixel unit and the photosensitive unit away from the base substrate.

According to a second aspect of the present disclosure, there is provided a method for fabricating a display panel. The method includes providing a base substrate. The method includes forming a plurality of pixel in array on one side of the base substrate. The method includes forming a plurality of photosensitive units. The photosensitive units and the pixel units are disposed on the same side of the base substrate and each of the photosensitive units being disposed between the adjacent pixel units.

In an exemplary arrangement of the present disclosure, the display panel includes a display region and forming a plurality of photosensitive units includes forming, in all or part of the display region, a plurality of photosensitive units which are disposed in array.

In an exemplary arrangement of the present disclosure, forming a plurality of photosensitive units includes: forming a plurality of first switching devices, the first switching devices and the pixel units being disposed on the same side of the base substrate and any one of the first switching devices being disposed between the adjacent pixel units; forming a plurality of first electrodes disposed on the same side of the base substrate as the pixel units, each of the first electrodes being disposed in one-to-one correspondence to each of the first switching devices and any one of the first electrodes being electrically connected to an input end of the first switching device corresponding thereto; and forming a plurality of photosensitive elements, each of the photosensitive elements being disposed in one-to-one correspondence to each of the first electrodes and any one of the photosensitive elements being disposed on a surface of the corresponding first electrode away from the substrate.

In an exemplary arrangement of the present disclosure, the first switching device is a first thin film transistor which has a source or drain electrode electrically connected to the first electrode. The first thin film transistor is an oxide thin film transistor or an organic thin film transistor.

According to a third aspect of the present disclosure, there is provided a display device. The display device includes the above-described display panel. The display device includes a first driving circuit configured to drive the pixel units of the display panel to emit light. The display device includes a second driving circuit configured to drive the photosensitive units of the display panel to output a detection signal. The display device includes a fingerprint recognition circuit configured to receive the detection signal and perform fingerprint recognition. According to a fourth aspect of the present disclosure, there is provided a fingerprint recognition method applied to the above display device. The method includes outputting a first control signal to a target pixel unit so that the target pixel unit emits light. The light emitted from the target pixel unit enters the photosensitive unit after the light is reflected by an object to be recognized. The photosensitive unit generates a detection signal. The method includes outputting a second control signal to the photosensitive unit so that the photosensitive unit outputs the detection signal. The method includes receiving the detection signal to perform fingerprint recognition according to the detection signal.

In an exemplary arrangement of the present disclosure, the display panel is provided with a touch circuit layer, and the display device further includes a control circuit configured to receive a touch signal outputted by the touch circuit layer in response to the object to be recognized and determine the target pixel unit according to the touch signal.

The fingerprint recognition method further includes receiving the touch signal outputted by the touch circuit layer in response to the object to be recognized. The fingerprint recognition method further includes judging whether the touch signal is a predetermined signal. The fingerprint recognition method further includes determining the target pixel unit according to the touch signal if it is determined that the touch signal is the predetermined signal.

DETAILED DESCRIPTION

Figure 1:
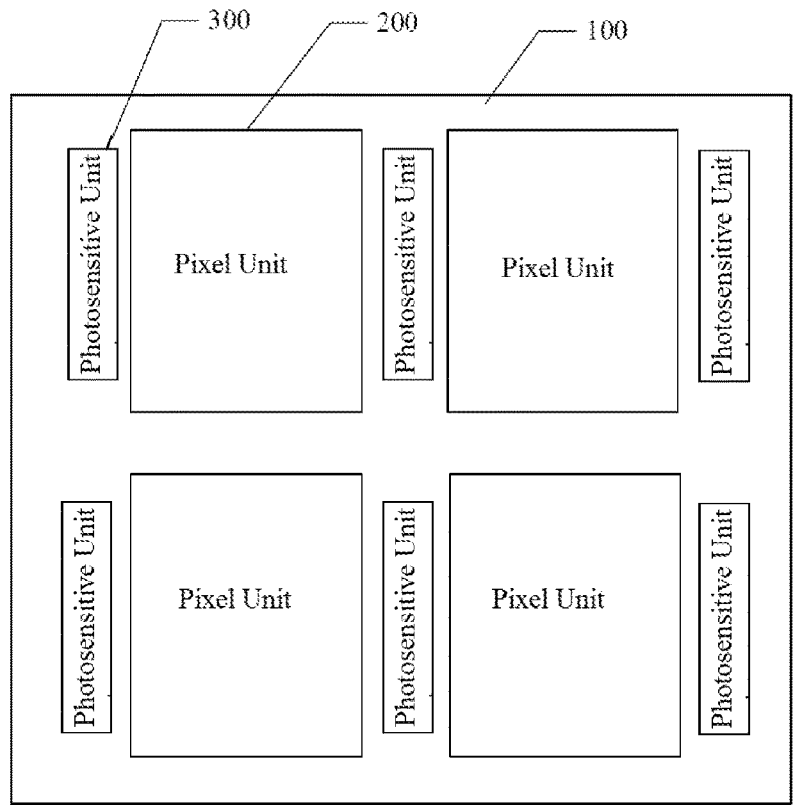
FIG. 1 is a block diagram illustrating a display panel according to an arrangement of the present disclosure.

The exemplary arrangements will now be described more fully with reference to the accompanying drawings. However, the exemplary arrangements can be implemented in various forms and should not be understood as being limited to the examples set forth herein; rather, these arrangements are provided so that this disclosure will be thorough and complete, and the concept of these arrangements will be fully conveyed to those skilled in the art. The features, structures or characteristics described herein may be combined in one or more arrangements in any suitable manner. In the following description, numerous specific details are provided so as to allow a full understanding of the arrangements of the present disclosure.

Thicknesses of regions and layers in the figures may be exaggerated for clarity. The same reference numerals in the figures denote the same or similar structures and thus the detailed descriptions of them will be omitted.

When a structure is referred to as being "on" another structure, it means that the structure is integrally formed on another structure or "directly" disposed on another structure or "indirectly" disposed on another structure through an additional structure. Terms "a", "an" and "the" denote the presence of one or more elements/components; terms "including" and "having" denote open-ended inclusives and the presence of additional elements/components in addition to the listed elements/components. Terms "first" and "second" are used as labels only and are not intended to limit the number of objects.

There is provided a display panel which is used for implementing in-screen fingerprint recognition in an arrangement of the present disclosure. As shown in FIG. 1, the display panel includes a base substrate 100, a plurality of pixel units 200 and a plurality of photosensitive units 300. The pixel units 200 are arrayed on one side of the base substrate 100, the photosensitive units 300 are disposed on the same side of the base substrate 100 as the pixel units 200 and any one of the photosensitive units 300 is disposed between the adjacent pixel units 200.

The display panel provided by the present disclosure includes the pixel units 200 and the photosensitive units 300. The pixel units 200 may be not only used for image display but also providing a light source for the photosensitive units 300 at the time of fingerprint recognition. Thus, when the fingerprint recognition is performed, detection light emitted from the pixel units 200 enters the photosensitive units 300 after it is reflected by a finger or the like and then the photosensitive units 300 may convert an optical signal reflected by the finger into an electrical signal. The electrical signal generated by the respective photosensitive units 300 disposed in the form of array may be used for the recognition of fingerprints of the finger to achieve in-screen fingerprint recognition. There is no need for the display panel to be used in combination with other specially-designed fingerprint recognition sensors, which avoids the occupying of a display space by such sensors and also facilitates the increasing of a screen-to-body ratio of a display device.

Components of the display panel provided by the arrangement of the present disclosure will be described in detail below with reference to the accompanying drawings.

In an arrangement, the display panel may include a display region and the photosensitive units 300 may be arrayed in the whole display region. In this way, fingerprint recognition may be carried out at any position in the display region and thus full-screen fingerprint recognition is realized. By full-screen fingerprint recognition, there is no need for a user to touch a specified area upon fingerprint recognition which makes it easier to operate. The full-screen fingerprint recognition widens a fingerprint recognition region and may recognize fingerprints of multiple fingers at the same time, which improves the safety compared with single-finger fingerprint recognition. Certainly, in another arrangement, part of the display region may be set as a fingerprint recognition area in which the photosensitive units 300 are arranged in an array to realize in-screen fingerprint recognition in the fingerprint recognition area.

Figure 2:
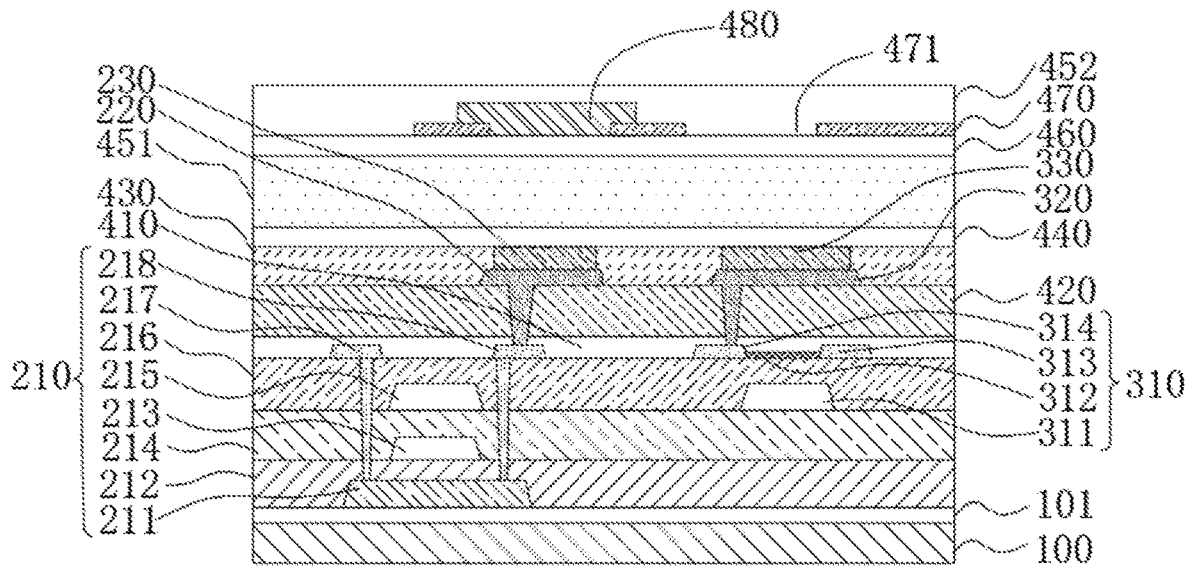
FIG. 2 is a structural schematic diagram illustrating a display panel according to an arrangement of the present disclosure.

As shown in FIG. 2, any of the photosensitive units 300 may include a first electrode 320, a photosensitive element 330 and a first switching device. The first electrode 320 may be disposed on one side of the base substrate 100. The photosensitive element 330 may be disposed on a surface of the first electrode 320 away from the base substrate 100. The first switching device may be disposed on one side of the base substrate 100 and it has an input end electrically connected to the first electrode 320.

It is to be understood that a surface of the photosensitive element 330 away from the base substrate 100 can also be electrically connected to a third electrode to form a path together with the first electrode 320, through which a current of the photosensitive element 330 passes, so as to facilitate the reading of an electrical signal generated by the photosensitive element 330. In an arrangement, as shown in FIG. 2, the third electrode may be a common electrode 440. Thus, there is no need for the display panel to specifically provide an electrode lead electrically connected to the third electrode and the common electrode 440 may be used to provide a current path and a bias voltage for the photosensitive elements 330, which simplifies the structure of the display panel, minimizes the complexity of fabrication processes and reduces the cost of the display panel.

At least one of the first electrode 320 and the third electrode may be made of a transparent conductive material to allow the entering of detection light into the photosensitive element 330. Which one of the electrodes is made of a transparent material is determined on the basis of a light-emitting direction of the display panel, so that the one close to a light-emitting surface of the display panel is made of a transparent conductive material. For example, in an arrangement, the display of the display panel is enabled on one side away from the base substrate 100 such that the third electrode is made of a transparent conductive material such as ITO (Indium Tin Oxide) or the like. The first electrode 320 may be made of a non-transparent conductive material, for example, a metal material such as silver, copper, tungsten, aluminum or an alloy thereof. Certainly, the first electrode 320 may also be made of a transparent conductive material and is provided with a light shielding layer on one side thereof away from the photosensitive element 330, which prevents the incidence of light inside the display panel into the photosensitive element 330 to generate an electrical interference signal.

The photosensitive element 330 may receive an external optical signal and convert it into an electrical signal. The photosensitive element 330 may be a PIN photodiode in an arrangement. The photosensitive element 330 may be an organic photodiode in another arrangement. A material of the organic photodiode may include, but not limited to, one or more of tetracene, pentacene, rubrene, titanium bronze, BPTT, F16CuPc, Spiro-4P-CPDT, DB-TTF, DT-TTF, Spiro-DPSP, TTF, TIPS-Pentacene, DPASP and PC61BM.

It is to be understood that the material of the organic photodiode needs to be selected and determined according to a wavelength of light to be detected, so that the organic photodiode may effectively convert the light to be detected into an electrical signal. In an arrangement, the control of the wavelength of the light to be detected can be achieved by controlling the pixel unit 200 to emit monochromatic light or mixed color light. For example, upon fingerprint recognition, a green sub-pixel of the pixel unit 200 can be controlled to emit green light, which then enters the organic photodiode after it is reflected by the finger; the organic photodiode is selected to be made of a material which efficiently converts the green light into an electrical signal, to enable the converting of the incident green light into the electrical signal. Since there are fingerprints (with ridges and valleys) in a finger and the ridges and valleys of the finger have different reflecting capacities, light reflected by the ridges and valleys is converted into electrical signals having different intensities. So, the fingerprints of the finger can be recognized through the analysis of the intensities of the electrical signals.

As shown in FIG. 2, the first switching device may be a first thin film transistor 310. The first thin film transistor 310 has a source electrode or a drain electrode which is an input end electrically connected to the first electrode 320, to output the electrical signal generated by the photosensitive element 330 in the form of a detection signal. In order to reduce current loss of the first thin film transistor 310 and ensure that the first switching device can accurately output the electrical signal generated by the photosensitive element 330, the first thin film transistor 310 may be an oxide thin film transistor or an organic thin film transistor. Since the oxide thin film transistor and the organic thin film transistor have stable process, good uniformity and small leakage current, there is no need for compensation for its threshold voltage by a compensation circuit; this may simplify a control circuit to which the photosensitive element 330 is electrically connected in such a manner it includes only the first thin film transistor 310, so that the photosensitive unit 300 has an extremely small size and can be embedded in gaps among the pixel units 200 without affecting the distribution of the pixel units 200 in the display panel. Therefore, the display panel of the present disclosure can realize in-screen fingerprint recognition without lowering PPI (pixel density) and an aperture ratio.

It should be understood that the photosensitive elements 330 in the form of array may output the electrical signals, respectively, by scanning. For example, in an arrangement, the first thin film transistors 310 in the same row have gate electrodes which are electrically connected to the same gate line and the first thin film transistors 310 in the same column have output ends (source electrodes or drain electrodes) which are electrically connected to the same data line. In this way, scan signals can be outputted to the gate lines in sequence, so that the first thin film transistors 310 in different rows are sequentially turned on; when the first thin film transistors 310 in any row are turned on, the electrical signals on the photosensitive elements 330 corresponding thereto are transmitted to the data lines to which they are electrically connected, respectively, in the form of detection signals, to enable the reading of the electrical signals on the photosensitive elements 330 in this row.

In an arrangement, the photosensitive unit 300 may further include an amplification circuit. The amplification circuit has an input end which is electrically connected to the output end of the first thin film transistor 310 for amplifying the detection signal outputted by the photosensitive unit 300. Any of the photosensitive units 300 may be provided with a separate amplification circuit which has an output end electrically connected to the data line. Certainly, the photosensitive units 300 electrically connected to the same data line may also use the same amplification circuit, that is, the photosensitive units 300 are electrically connected to the data line, and an output end of each data line is electrically connected to the amplification circuit. The amplification circuit may be an integral amplification circuit.

As shown in FIG. 2, any of the pixel units 200 may include a second thin film transistor 210 for the control of the pixel unit 200. The second thin film transistor 210 and the first thin film transistor 310 are disposed on the same side of the base substrate 100. The second thin film transistor 210 has a gate electrode which is disposed on the same layer and made of the same material as those of the gate electrode of the first thin film transistor 310; and has source and drain electrodes which are disposed on the same layer and are made of the same material as those of the source and drain electrodes of the first thin film transistor 310. When the display panel is fabricated, the gate electrodes of the first and second thin film transistors 310 and 210 can be manufactured simultaneously and the source and drain electrodes of the first and second thin film transistors 310 and 210 can also be manufactured simultaneously, which can not only simplify processing blocks but also reduce the manufacturing cost of the display panel.

As shown in FIG. 2, any of the pixel units 200 may further include a second electrode 220 and a light-emitting element 230 disposed on a surface of the second electrode 220 away from the base substrate 100. The second electrode 220 is electrically connected to the source or drain electrode of the second thin film transistor 210. The second electrode 220 and the first electrode 320 can be disposed on the same layer and made of the same material. Thus, when the display panel is prepared, the first electrode 320 and the second electrode 220 can be fabricated at the same time, which can not only simplify the processing blocks but also reduce the manufacturing cost of the display panel.

The light-emitting element 230 may be a light-emitting diode, for example, a small molecule OLED (organic light-emitting diode) or a PLED (polymer organic light-emitting diode), which is not specifically limited in the present disclosure.

It is to be understood that the pixel unit 200 also needs a fourth electrode disposed on a surface of the light-emitting element 230 away from the base substrate 100, so that the light-emitting unit forms a path between the second electrode 220 and the fourth electrode. In an arrangement, as shown in FIG. 2, the fourth electrode may be a common electrode 440 which is an integrated structure. The common electrode 440 can be used to provide a current path and a bias voltage for each of the light-emitting elements 230, which simplifies the structure of the display panel, minimizes the complexity of the preparation process and reduces the cost of the display panel.

In an arrangement, the pixel unit 200 may be a monochrome pixel unit 200, for example, it can only realize gray scale display. So, the pixel unit 200 may include only one sub-pixel. In another arrangement, the pixel unit 200 may be a color pixel unit 200 that forms colored light by the combination of a plurality of different light. The pixel unit 200 may include a plurality of sub-pixels, each of which needs to be correspondingly provided with a second thin film transistor 210, a second electrode 220 and a light-emitting element 230. For example, the pixel unit 200 may be a RGB pixel unit 200 or a WRGB pixel unit 200.

As shown in FIG. 2, the display panel may further include a black matrix layer 470, which may be disposed on one side of the pixel unit 200 and the photosensitive unit 300 away from the base substrate 100. The black matrix layer 470 is provided with a plurality of light-transmitting windows 471. The light-transmitting windows 471 may be divided into two types of light-transmitting windows depending on their positions, that is, first and second light-transmitting windows the number of which is plural. Each of the first light-transmitting windows is disposed in one-to-one correspondence to each of the sub-pixels of each of the pixel units. An orthographic projection of any of the sub-pixels on the base substrate is at least partially overlapped with an orthographic projection of the first light-transmitting window corresponding thereto on the base substrate. Each of the second light-transmitting windows is disposed in one-to-one correspondence to each of the photosensitive units. An orthographic projection of any of the photosensitive units on the base substrate is at least partially overlapped with an orthographic projection of the second light-transmitting window corresponding thereto on the base substrate.

Thus, the photosensitive element 330 of each photosensitive unit 300 is disposed corresponding to one light-transmitting window 471 to ensure that the detection light reflected by the finger can be incident into the photosensitive element 330 by passing through the light-transmitting window 471. The light-emitting element 230 of each sub-pixel is disposed corresponding to one light-transmitting window 471 to ensure that light emitted by each sub-pixel passes through the light-transmitting window 471. The black matrix layer 470 may serve as a light-scattering structure, so that light emitted by the pixel unit 200 needs to be reflected at a certain angle to be incident into the photosensitive unit 300, which ensures the angle of the light entering the photosensitive element 330.

As shown in FIG. 2, the display panel may further include a color film layer 480 which is disposed on one side of the pixel unit 200 and the photosensitive unit 300 away from the base substrate 100. The color film layer 480 includes a plurality of color film units, each of which is disposed in one-to-one corresponding to each of the first light-transmitting windows. In this way, the color film layer 480 and the black matrix layer 470 may be used to replace a polarizer commonly used in the display panel, thus improving a light transmittance of light and reducing light loss. When fingerprints are recognized, the detection light will be emitted to the finger with less loss and the intensity of light is greater, so the detection light reflected by the finger is stronger; not only that, the detection light reflected by the finger will be incident on the photosensitive element 330 with less loss, which increases the intensity of the detection light incident on the photosensitive element 330.

As shown in FIG. 2, the display panel may further include a touch circuit layer 460 which is disposed on one side of the pixel unit 200 and the photosensitive unit 300 away from the base substrate 100. Thus, the display panel may achieve a touch function. In an arrangement, the touch circuit layer 460 may be disposed on a side of the black matrix layer 470 close to the base substrate 100.

Hereinafter, the structure of the display panel of the present disclosure will be further explained and described based on a specific arrangement. As shown in FIG. 2, the display panel may include a base substrate 100. The display panel may include a buffer layer 101 which is disposed on one side of the base substrate 100. The display panel may include a second active layer 211 which is disposed on one side of the buffer layer 101 away from the base substrate 100 and serves as an active layer of a second thin film transistor 210. The second active layer 211 may be a low temperature polysilicon layer. The display panel may include a third gate insulating layer 212 covering the second active layer 211. The display panel may include a third gate electrode 213 which is disposed on one side of the third gate insulating layer 212 away from the base substrate 100 and serves as a gate electrode of the second thin film transistor 210. The display panel may include a second gate insulating layer 214 covering the third gate electrode 213. The display panel may include a second gate electrode 215 which is disposed on a surface of the second gate insulating layer 214 away from the base substrate 100 and serves as a gate electrode of the second thin film transistor 210. The display panel may include a first gate electrode 311 which is disposed on the same layer as the second gate electrode 215, that is, disposed on the surface of the second gate insulating layer 214 away from the base substrate 100 and serves as a gate electrode of the first thin film transistor 310. The display panel may include a first gate insulating layer 216 covering the first gate electrode 311 and the second gate electrode 215. The display panel may include a second source electrode 217 which is disposed on the surface of the first gate insulating layer 216 away from the base substrate 100 and is electrically connected to the second active layer 211 through a metallization via and also serves as a source electrode of the second thin film transistor 210. The display panel may include a second drain electrode 218 which is disposed on the same layer as the second source electrode 217, that is, disposed on the surface of the first gate insulating layer 216 away from the base substrate 100. The second drain electrode 218 is electrically connected to the second active layer 211 through the metallization via and serves as a drain electrode of the second thin film transistor 210. The display panel may include a first active layer 312 disposed on the same layer as the second source electrode 217, that is, disposed on the surface of the first gate insulating layer 216 away from the base substrate 100. The first active layer 312 is used as an active layer of the first thin film transistor 310 and made of an organic semiconductor material. The display panel may include a first source electrode 313 disposed on the same layer as the first active layer 312, that is, disposed on the surface of the first gate insulating layer 216 away from the base substrate 100. The first source electrode 313 serves as a source electrode of the first thin film transistor 310. The display panel may include a first drain electrode 314 disposed on the same layer as the first active layer 312 and connected to the first active layer 312, that is, on the surface of the first gate insulating layer 216 away from the base substrate 100. The first drain electrode 314 being used as a drain electrode of the first thin film transistor 310. The display panel may include an interlayer dielectric layer 410 which covers the first source electrode 313, the first drain electrode 314, the first active layer 312, the second source electrode 217 and the second drain electrode 218. The display panel may include a planarization layer 420 which is disposed on one side of the interlayer dielectric layer 410 away from the base substrate 100. The display panel may include a first electrode 320 which is disposed on a surface of the planarization layer 420 away from the base substrate 100 and electrically connected to the first drain electrode 314 through a metallization via. The first electrode 320 may be opaque. The display panel may include a second electrode 220 disposed on the same layer as the first electrode 320, that is, on the surface of the planarization layer 420 away from the base substrate 100. The second electrode 220 is electrically connected to the second drain electrode 218 through a metallization via. The display panel may include a pixel defining layer 430 disposed on one side of the planarization layer 420 away from the base substrate 100 and exposing, in the first electrode 320, a region in which a photosensitive element 330 is provided and exposing, in the second electrode 220, a region in which the light-emitting element 230 is provided. The display panel may include the photosensitive element 330 disposed in the region which is exposed by the first electrode 320 and in which a photosensitive element 330 is provided, and located on a surface of the first electrode 320 away from the base substrate 100. The display panel may include the light-emitting element 230 disposed in the region which is exposed by the second electrode 220 and in which a photosensitive element 230 is provided, and located on a surface of the second electrode 220 away from the base substrate 100. The display panel may include a common electrode 440 which covers a surface of the photosensitive element 330 and a surface of the light-emitting element 230 away from the base substrate 100 and is made of a transparent material. The display panel may include a first encapsulation layer 451 which is disposed on one side of the common electrode 440 away from the base substrate 100. The display panel may include a touch circuit layer 460 which is disposed on a side of the first encapsulation layer 451 away from the base substrate 100. The display panel may include a black matrix layer 470 which is disposed on one side of the touch circuit layer 460 away from the base substrate 100. The display panel may include a color film layer 480 which is disposed on one side of the black matrix layer 470 away from the base substrate 100. The display panel may include a second encapsulation layer 452 which is disposed on one side of the color film layer 480 away from the base substrate 100.

Figure 3:
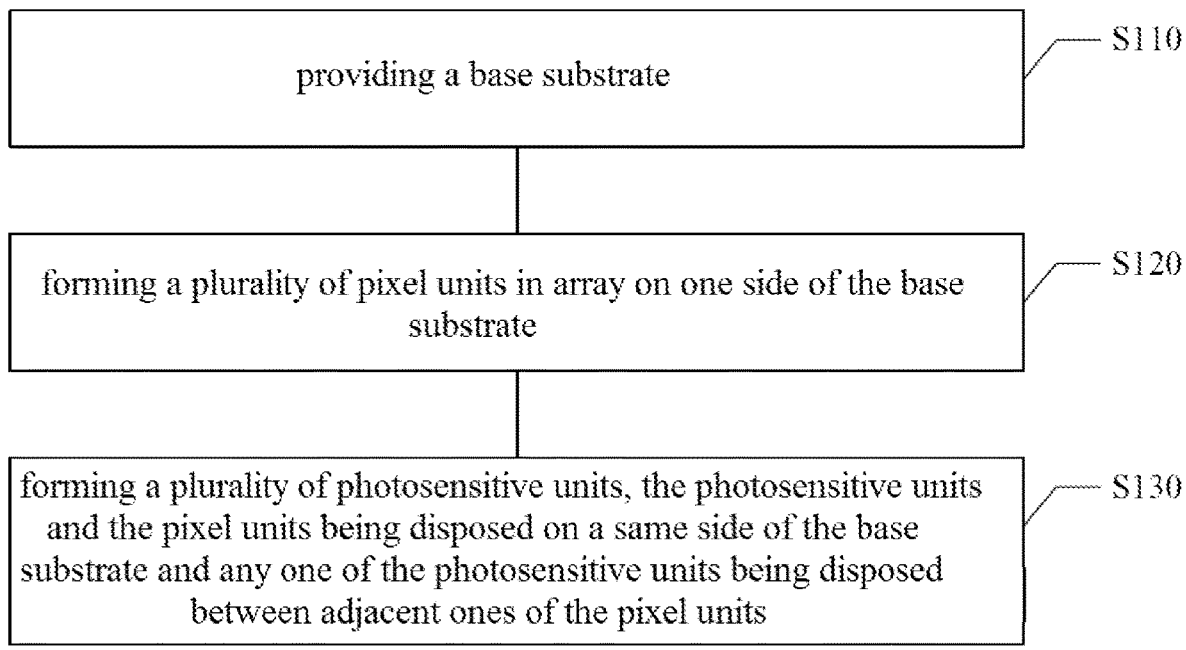
FIG. 3 is a flow chart showing a method for fabricating a display panel according to an arrangement of the present disclosure.

The present disclosure further provides a method for fabricating a display panel. The method is used for fabricating a display panel which realizes in-screen fingerprint recognition. As shown in FIG. 3, the method includes the following blocks.

In block S110, a base substrate 100 is provided.

In block S120, a plurality of pixel units 200 in form of array are formed on one side of the base substrate 100.

In block S130, a plurality of photosensitive units 300 are formed. The photosensitive units 300 and the pixel units 200 are disposed on the same side of the base substrate 100 and any of the photosensitive units 300 is disposed between the adjacent pixel units 200.

The display panel fabricated by the method provided by the present disclosure includes pixel units 200 and photosensitive units 300. The pixel units 200 may be not only used for image display but also providing a light source for the photosensitive units 300 during fingerprint recognition. Thus, when the fingerprint recognition is performed, light emitted from the pixel units 200 enters the photosensitive units 300 after it is reflected by a finger or the like and then the photosensitive units 300 may convert an optical signal reflected by the finger into an electrical signal. The electrical signal generated by the respective photosensitive units 300 disposed in the form of array may be used for the recognition of fingerprints of the finger to achieve in-screen fingerprint recognition. There is no need for the display panel to be used in combination with other specially-designed fingerprint recognition sensors, which avoids the occupying of a display space by such sensors and also facilitates the increasing of a screen-to-body ratio of a display device.

In an arrangement, the display panel includes a display region. In block S130, the photosensitive units 300 provided in array are formed in all or part of the display region.

When the photosensitive units 300 arranged in the form of array are formed in all of the display region, the formed display panel may realize full-screen fingerprint recognition. By full-screen fingerprint recognition, there is no need for a user to touch a specified area upon fingerprint recognition which makes it easier to operate. The full-screen fingerprint recognition widens a fingerprint recognition region and may recognize fingerprints of multiple fingers at the same time, which improves the security compared with single-finger fingerprint recognition. When the photosensitive units 300 arranged in an array are formed in part of the display region, the region in which the photosensitive units 300 are provided is formed as a fingerprint recognition region in which the display panel may realize in-screen fingerprint recognition.

The block S130 may be implemented using the following method.

In block S210, a plurality of first switching devices are formed. The first switching devices are disposed on the same side of the base substrate 100 as the pixel units 200 and any of the first switching devices is disposed between the adjacent pixel units 200.

In block S220, a plurality of first electrodes 320 are formed. The first electrodes and the pixel units 200 are disposed on the same side of the base substrate 100. Each of the first electrodes 320 is disposed in one-to-one correspondence to each of the first switching devices and any of the first electrodes 320 is electrically connected to an input end of the first switching device corresponding thereto.

In block S230, a plurality of photosensitive elements 330 are formed. Each of the photosensitive elements 330 is disposed in one-to-one correspondence to each of the first electrodes 320 and any of the photosensitive elements 330 is disposed on a surface of the corresponding first electrode 320 away from the base substrate 100.

In the block S210, the first switching device is a first thin film transistor 310 which has a source or drain electrode electrically connected to the first electrode 320. The first thin film transistor 310 is an oxide thin film transistor or an organic thin film transistor. Since the oxide thin film transistor and the organic thin film transistor have stable process, good uniformity and small leakage current, there is no need for compensation for its threshold voltage by a compensation circuit; this may simplify a control circuit to which the photosensitive element 330 is electrically connected in such a manner it includes only the first thin film transistor 310, so that the photosensitive unit 300 has an extremely small size and can be embedded in gaps among the pixel units 200 without affecting the distribution of the pixel units 200 in the fabricated display panel. Therefore, the display panel manufactured by the method of the present disclosure can realize in-screen fingerprint recognition without lowering PPI (pixel density) and an aperture ratio.

It is to be explained that although the blocks of the method in the present disclosure are described in the accompanying drawings in a particular order, it is not required or implied that they must be carried out in such order, or the expected result can be achieved only by carrying out all of the blocks that are illustrated. Additionally or alternatively, some of them may be omitted, or many blocks may be combined into one block to be performed, and/or one block is divided into a number of blocks to be performed, all of which shall be regarded as part of the present disclosure.

Figure 4:
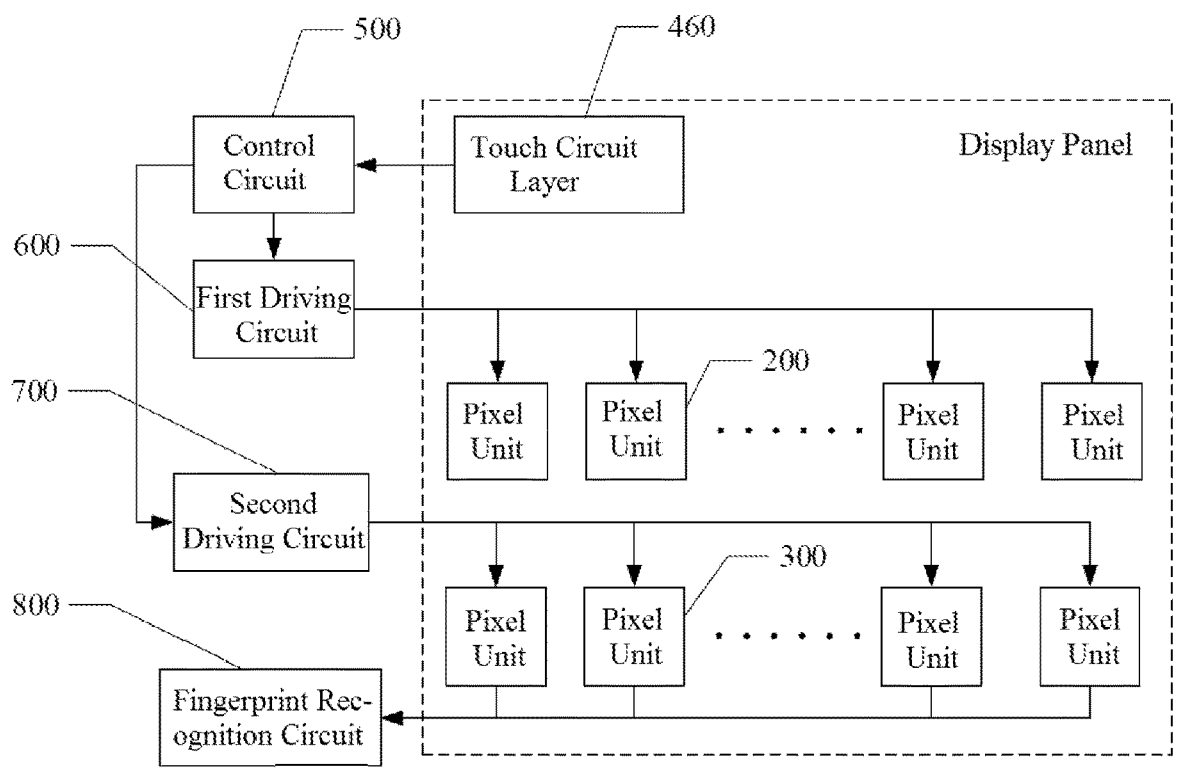
FIG. 4 is a block diagram illustrating a display device according to an arrangement of the present disclosure.

The present disclosure further provides a display device, which includes any of the display panels described in the above-mentioned arrangements, as shown in FIG. 4. The display device further includes a first driving circuit 600 configured to drive the pixel units 200 of the display panel to emit light, a second driving circuit 700 configured to drive the photosensitive units 300 of the display panel to output a detection signal, and a fingerprint recognition circuit 800 configured to receive the detection signal and perform fingerprint recognition.

The display device may be a display screen of a smart phone, a display screen of a notebook computer, a display screen of an access control system or other devices, which is not specifically limited in the present disclosure. The display panel used in the display device in the arrangement of the present disclosure is the same as that in the above-described arrangements, therefore, they have the same advantageous effects, and details thereof will not be elaborated herein.

In an arrangement, the display panel is provided with a touch circuit layer 460; the display device further includes a control circuit 500 configured to receive a touch signal output by the touch circuit layer 460 in response to an object to be recognized and determine a target pixel unit 200 according to the touch signal.

It should be understood that the control circuit 500, the first driving circuit 600, the second driving circuit 700 and the fingerprint recognition circuit 800 may be composed of a transistor, a capacitor, a resistor, a diode and other elements, which is not particularly limited in the present disclosure. In an arrangement, the control circuit 500, the first driving circuit 600, the second driving circuit 700 and the fingerprint recognition circuit 800 may be integrated on an integrated circuit.

Figure 5:
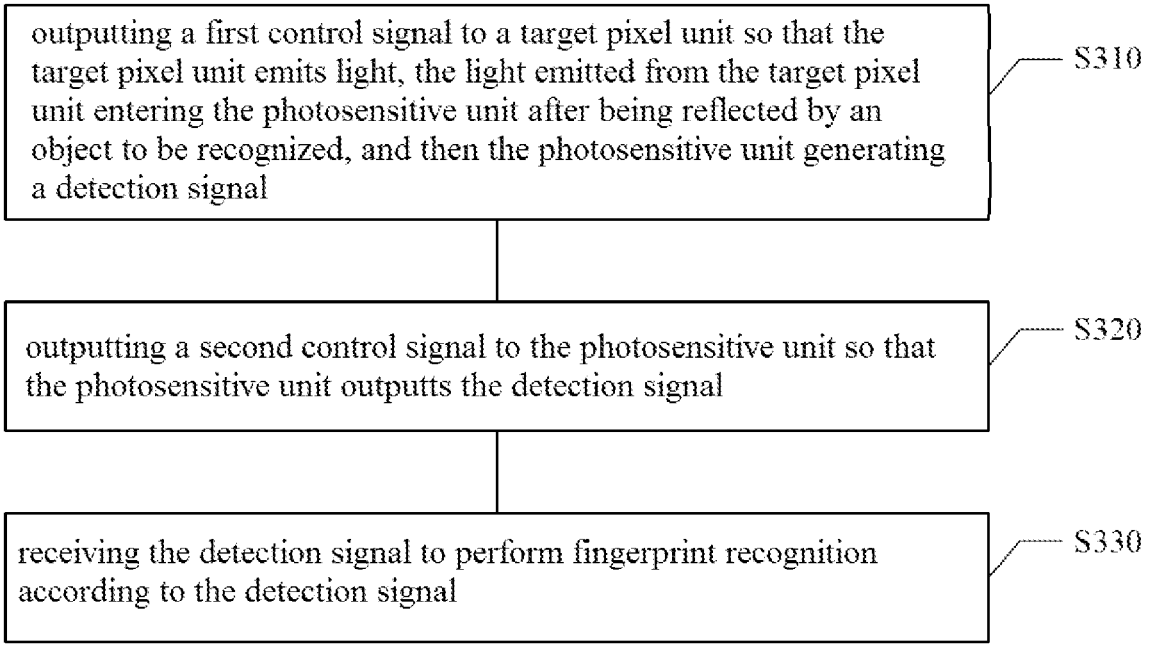
FIG. 5 is a flow chart showing a fingerprint recognition method according to an arrangement of the present disclosure.

The present disclosure further provides a fingerprint recognition method applied to any of the display devices described in the above-mentioned arrangements. As shown in FIG. 5, the fingerprint recognition method includes the following blocks.

In block S310, a first control signal is outputted to a target pixel unit 200 so that the target pixel unit 200 emits light, and the light emitted from the target pixel unit 200 enters a photosensitive unit 300 after it is reflected by an object to be recognized, and then the photosensitive unit 300 generates a detection signal.

In block S320, a second control signal is outputted to the photosensitive unit 300 so that the photosensitive unit 300 outputs the detection signal.

In block S330, the detection signal is received and fingerprint recognition is performed according to the detection signal.

Figure 6:
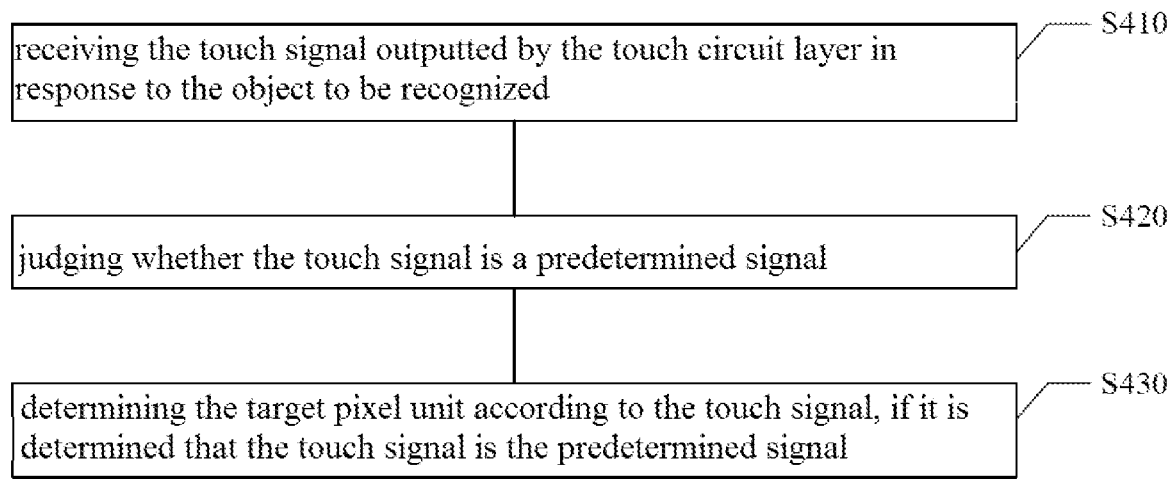
FIG. 6 is a flow chart showing a fingerprint recognition method according to an arrangement of the present disclosure.

In an arrangement, a touch circuit layer 460 is provided in the display panel; the display device further includes a control circuit 500 configured to receive a touch signal outputted by the touch circuit layer 460 in response to an object to be recognized and determine a target pixel unit 200 according to the touch signal. As shown in FIG. 6, the fingerprint recognition method may further include the following blocks.

In block S410, a touch signal outputted by the touch circuit layer 460 in response to an object to be recognized is received.

In block S420, it is judged whether the touch signal is a predetermined signal.

In block S430, if it is determined that the touch signal is an expected signal, the target pixel unit 200 is decided according to the touch signal.

Hereinafter, the fingerprint recognition method of the present disclosure will be explained and described with reference to a specific fingerprint recognition process.

When a finger presses a display panel, the touch circuit layer 460 may generate a touch signal in response to the pressing of the finger. The control circuit 500 may receive the touch signal and judge whether the touch signal is a predetermined signal. In an arrangement, a duration threshold value may be set and when a duration of the touch signal exceeds the duration threshold value, it is determined that the touch signal is the predetermined signal. For example, the duration threshold value may be set as 1 second and when the finger presses a screen for more than 1 second, the touch signal generated by pressing is the predetermined signal.

After determining the touch signal as a predetermined signal, the control circuit 500 may determine the region pressed by the finger according to the touch signal and then determine that the pixel unit 200 included in the region pressed by the finger is the target pixel unit 200.

The first driving circuit 600 may output a first control signal to the target pixel unit 200 such that the target pixel unit 200 emits light which is used as a light source for fingerprint recognition. In an arrangement, the first driving circuit 600 may drive one sub-pixel of the target pixel unit 200 to emit light, for example, drive a green sub-pixel to emit green light. The light emitted from the target pixel unit 200 enters the photosensitive unit 300 after it is reflected by the finger, so that the photosensitive unit 300 generates a detection signal.

The second driving circuit 700 may output a second control signal to the photosensitive unit 300 such that the photosensitive unit 300 outputs the detection signal.

The fingerprint recognition circuit 800 may receive the detection signal and perform fingerprint recognition based on the detection signal.

In an arrangement, the control circuit 500 may output an address of the target pixel unit 200 and a control command to the first driving circuit 600 so that the first driving circuit 600 outputs the first control signal to the target pixel unit 200; the control circuit 500 also outputs another control command to the second driving circuit 700 such that the second driving circuit 700 outputs the second control signal to the photosensitive unit 300, thus the first driving circuit 600 and the second driving circuit 700 are used cooperatively in timing.

It is to be explained that although the blocks of the method in the present disclosure are described in the accompanying drawings in a particular order, it is not required or implied that they must be carried out in such order, or the expected result can be achieved only by carrying out all of the blocks that are illustrated. Additionally or alternatively, some of them may be omitted, or many blocks may be combined into one block to be performed, and/or one block is divided into a number of blocks to be performed, all of which shall be regarded as part of the present disclosure.

It should be understood that the present disclosure does not limit its application to the detailed structure and arrangement of the components presented in the specification. The present disclosure includes other arrangements and can be embodied and carried out in various arrangements. The foregoing variations and modifications are intended to fall within the scope of the present disclosure. It is to be understood that the disclosure as disclosed and defined in the specification extends to all alternative combinations of two or more individual features that are mentioned or apparent in text and/or the drawings. All of these different combinations form a number of alternative aspects of the present disclosure. The arrangements described in the specification are illustrative of the best mode for carrying out the present disclosure and will enable those skilled in the art to utilize this disclosure.

What is claimed is:

1. A display panel, comprising:
a base substrate;
a plurality of pixel units disposed in array on one side of the base substrate;
a plurality of photosensitive units disposed on the same side of the base substrate, wherein each of the photosensitive units is disposed between adjacent ones of the pixel units, and each of the photosensitive units comprises:
 a first electrode disposed on the side of the base substrate;
 a photosensitive element disposed on a surface of the first electrode away from the base substrate; and
 a first switching device, which is a first thin film transistor, disposed on the side of the base substrate and having an input end electrically connected to the first electrode;
and a touch circuit layer disposed on one side of the pixel units and the photosensitive units away from the base substrate,
wherein each of the pixel units comprises:
 a second electrode disposed on a same layer and made of a same material as those of the first electrode; and
 a light-emitting element disposed on a surface of the second electrode away from the base substrate; and
wherein a common electrode is disposed on a surface of the photosensitive element away from the first electrode and on a surface of the light-emitting element away from the second electrode, and the common electrode is an integral structure,
wherein a first driving circuit is configured to drive the plurality of pixel units to emit light;

wherein a second driving circuit is configured to drive the plurality of photosensitive units to output a detection signal; and wherein a fingerprint recognition circuit is configured to receive the detection signal and perform fingerprint recognition, wherein a control circuit is configured to receive a touch signal outputted by the touch circuit layer in response to the object that is to be recognized and determine the target pixel unit according to the touch signal;

wherein the touch signal, outputted by the touch circuit layer, is received in response to the object that is to be recognized;

wherein the touch signal is judged whether it is a predetermined signal; and wherein a target pixel unit is determined according to the touch signal, when it is determined that the touch signal is the predetermined signal, wherein a first control signal is output to the target pixel unit so that the target pixel unit emits light, the light emitted from the target pixel unit enters the photosensitive units after being reflected by an object that is to be recognized, and then the photosensitive units generates a detection signal; and wherein a second control signal is output to the photosensitive units so that the photosensitive units output the detection signal.

2. The display panel of claim 1, wherein the display panel comprises a display region and the plurality of photosensitive units are disposed in array in at least a part of the display region.

3. The display panel of claim 1, wherein the first switching device has a source electrode and a drain electrode, one of which is electrically connected to the first electrode; and the first thin film transistor is one of an oxide thin film transistor and an organic thin film transistor.

4. The display panel of claim 3, wherein each of the pixel units comprises: a second thin film transistor disposed on the side of the base substrate; wherein the second thin film transistor has a gate electrode which is disposed on a same layer as a layer of a gate electrode of the first thin film transistor and made of a same material as a material of a gate electrode of the first thin film transistor, and has source and drain electrodes which are disposed on a same layer and are made of a same material as those of the source and drain electrodes of the first thin film transistor.

5. The display panel of claim 4, wherein each of the pixel units further comprises: the second electrode electrically connected to one of the source and drain electrodes of the second thin film transistor.

6. The display panel of claim 1, further comprising: a black matrix layer disposed on one side of the pixel units and the photosensitive units away from the substrate; a plurality of first light-transmitting windows disposed in the black matrix layer and each of which being disposed in one-to-one correspondence to each of a plurality of sub-pixels of each of the pixel units, and an orthographic projection of each of the sub-pixels on the base substrate being at least partially overlapped with an orthographic projection of one of the first light-transmitting windows corresponding thereto on the base substrate; a plurality of second light-transmitting windows disposed on the black matrix layer and each of which being disposed in one-to-one correspondence to each of the photosensitive units, and an orthographic projection of any of the photosensitive units on the base substrate being at least partially overlapped with an orthographic projection of one of the second light-transmitting windows corresponding thereto on the base substrate.

7. The display panel of claim 6, further comprising: a color film layer disposed on the one side of the pixel units and the photosensitive units away from the base substrate and comprising a plurality of color film units, wherein each of the color film units is disposed in one-to-one correspondence to each of the sub-pixels of each of the pixel units; and an orthographic projection of each of the color film units on the base substrate is at least partially overlapped with an orthographic projection of one of the sub-pixels corresponding thereto on the base substrate.

8. A display device, comprising:
a display panel, comprising:
  a base substrate,
  a plurality of photosensitive units disposed on the same side of the base substrate, wherein any one of the photosensitive units is disposed between adjacent ones of the pixel units, and each of the photosensitive units comprises:
    a first electrode disposed on the side of the base substrate;
    a photosensitive element disposed on a surface of the first electrode away from the base substrate; and
    a first switching device, which is a first thin film transistor, disposed on the side of the base substrate and having an input end electrically connected to the first electrode;
  a plurality of pixel units disposed in array on one side of the base substrate, wherein each of the pixel units comprises:
    a second electrode disposed on a same layer and made of a same material as those of the first electrode; and
    a light-emitting element disposed on a surface of the second electrode away from the base substrate; and
    a common electrode that is disposed on a surface of the photosensitive element away from the first electrode and on a surface of the light-emitting element away from the second electrode, and the common electrode is an integral structure; and
  a touch circuit layer disposed on one side of the pixel units and the photosensitive units away from the base substrate,
a first driving circuit configured to drive the pixel units of the display panel to emit light;
a second driving circuit configured to drive the photosensitive units of the display panel to output a detection signal;
a fingerprint recognition circuit configured to receive the detection signal and perform fingerprint recognition; and
a control circuit configured to receive a touch signal outputted by the touch circuit layer in response to the object that is to be recognized and determine the target pixel unit according to the touch signal;
wherein the touch signal, outputted by the touch circuit layer, is received in response to the object that is to be recognized;
wherein the touch signal is judged whether it is a predetermined signal; and
wherein a target pixel unit is determined according to the touch signal, when it is determined that the touch signal is the predetermined signal,
wherein a first control signal is output to the target pixel unit so that the target pixel unit emits light, the light emitted from the target pixel unit enters the photosensitive units after being reflected by an object that is to be recognized, and then the photosensitive units generates a detection signal; and wherein a second control signal is output to the photosensitive units so that the photosensitive units output the detection signal.

9. The display device of claim 8, wherein the display panel comprises a display region and the plurality of photosensitive units are disposed in array in at least a part of the display region.

10. The display device of claim 8, wherein any one of the photosensitive units comprises: a first electrode disposed on the one side of the base substrate; a photosensitive element disposed on a surface of the first electrode away from the base substrate; and a first switching device disposed on the one side of the base substrate and having an input end electrically connected to the first electrode.

11. The display device of claim 10, wherein the first switching device is a first thin film transistor which has a source electrode and a drain electrode, one of which is electrically connected to the first electrode; and the first thin film transistor is one of an oxide thin film transistor and an organic thin film transistor.

12. A fingerprint recognition method applied to a display device comprising:

a display panel, comprising:
　a base substrate,
　a plurality of photosensitive units disposed on the same side of the base substrate, wherein any one of the photosensitive units is disposed between adjacent ones of the pixel units, and each of the photosensitive units comprises:
　　a first electrode disposed on the side of the base substrate;
　　a photosensitive element disposed on a surface of the first electrode away from the base substrate; and
　　a first switching device, which is a first thin film transistor, disposed on the side of the base substrate and having an input end electrically connected to the first electrode;
　a plurality of pixel units disposed in array on one side of the base substrate, wherein each of the pixel units comprises:
　　a second electrode disposed on a same layer and made of a same material as those of the first electrode; and
　　a light-emitting element disposed on a surface of the second electrode away from the base substrate; and
　　a common electrode that is disposed on a surface of the photosensitive element away from the first electrode and on a surface of the light-emitting element away from the second electrode, and the common electrode is an integral structure; and
　a touch circuit layer disposed on one side of the pixel units and the photosensitive units away from the base substrate, a first driving circuit configured to drive the pixel units of the display panel to emit light;

a second driving circuit configured to drive the photosensitive units of the display panel to output a detection signal;

a fingerprint recognition circuit configured to receive the detection signal and perform fingerprint recognition; and a control circuit configured to receive a touch signal outputted by the touch circuit layer in response to the object that is to be recognized and determine the target pixel unit according to the touch signal, the method comprising:

receiving the touch signal outputted by the touch circuit layer in response to the object to be recognized;

judging whether the touch signal is a predetermined signal;

determining a target pixel unit according to the touch signal, when it is determined that the touch signal is the predetermined signal;

outputting a first control signal to the target pixel unit so that the target pixel unit emits light, the light emitted from the target pixel unit entering the photosensitive units after being reflected by an object to be recognized, and then the photosensitive units generating a detection signal;

outputting a second control signal to the photosensitive units so that the photosensitive units output the detection signal; and receiving the detection signal to perform fingerprint recognition according to the detection signal.

* * * * *